United States Patent [19]

Baker

[11] Patent Number: 5,508,229

[45] Date of Patent: Apr. 16, 1996

[54] METHOD FOR FORMING SOLDER BUMPS IN SEMICONDUCTOR DEVICES

[75] Inventor: Mark H. Baker, San Jose, Calif.

[73] Assignee: National Semiconductor Corporation, Santa Clara, Calif.

[21] Appl. No.: 248,409

[22] Filed: May 24, 1994

[51] Int. Cl.⁶ ..................................... H01L 21/44
[52] U.S. Cl. ........... 437/183; 437/228; 437/245; 437/246; 148/DIG. 51; 148/DIG. 131; 228/180.22
[58] Field of Search ..................... 437/183, 245, 437/246, 228, 228 SE, 228 BO, 228 CON; 148/DIG. 131, DIG. 51; 228/180.22

[56] References Cited

U.S. PATENT DOCUMENTS

| | | | |
|---|---|---|---|
| 3,655,544 | 4/1972 | Rairden, III | 204/192 |
| 4,880,708 | 11/1989 | Sharma et al. | 428/620 |
| 4,922,322 | 5/1990 | Mathew | 357/69 |
| 5,094,979 | 3/1992 | Kusano | 437/183 |
| 5,108,950 | 4/1992 | Wakabayashi et al. | 437/183 |
| 5,118,584 | 6/1992 | Evans et al. | 430/313 |
| 5,124,269 | 6/1992 | Kobayashi et al. | 437/181 |
| 5,208,186 | 5/1993 | Mathew | 437/183 |
| 5,266,156 | 11/1993 | Nasr | 437/200 |
| 5,288,186 | 2/1994 | Mathew | 437/183 |
| 5,324,683 | 6/1994 | Fitch et al. | 437/65 |

FOREIGN PATENT DOCUMENTS 0261799  3/1988  European Pat. Off. .
55-138256 1/1981 Japan .
57-116776 10/1982 Japan .

Primary Examiner—George Fourson
Assistant Examiner—Long Pham
Attorney, Agent, or Firm—Hickman & Beyer

[57] ABSTRACT

In accordance with the present invention, a method for forming solder bumps begins with a wafer that has been patterned with bond pad areas. A plurality of distinct metal layers are then deposited over the wafer. Subsequently, solder is deposited by way of plating through a mask over the metal layers in the bond pad areas. After the removal of the mask, the metal layers outside of the soldered areas are etched using a dilute phosphoric acid solution, which includes phosphoric acid, acetic acid, hydrogen peroxide, and deionized water. By the use of this solution, the metal layers are removed without attacking the soldered areas. Thus, a pattern of solder bumps are formed. The metal layers include distinct layers of aluminum, nickel-vanadium, and copper. Alternatively, the aluminum layer is eliminated. Further, the dilute phosphoric acid solution has approximately 10% phosphoric acid, 84% deionized water, 5% acetic acid, and 1% hydrogen peroxide by volume, which is used for the etching step preferably performed at a temperature of approximately 70° C. for a period between about 60 to 600 seconds. With the present invention, a single etchant, a dilute phosphoric acid solution, is used to remove the deposited metal layers outside of the soldered areas. This increases the efficiency of forming solder bumps of high integrity, which are then suitable for flip chip applications.

29 Claims, 7 Drawing Sheets

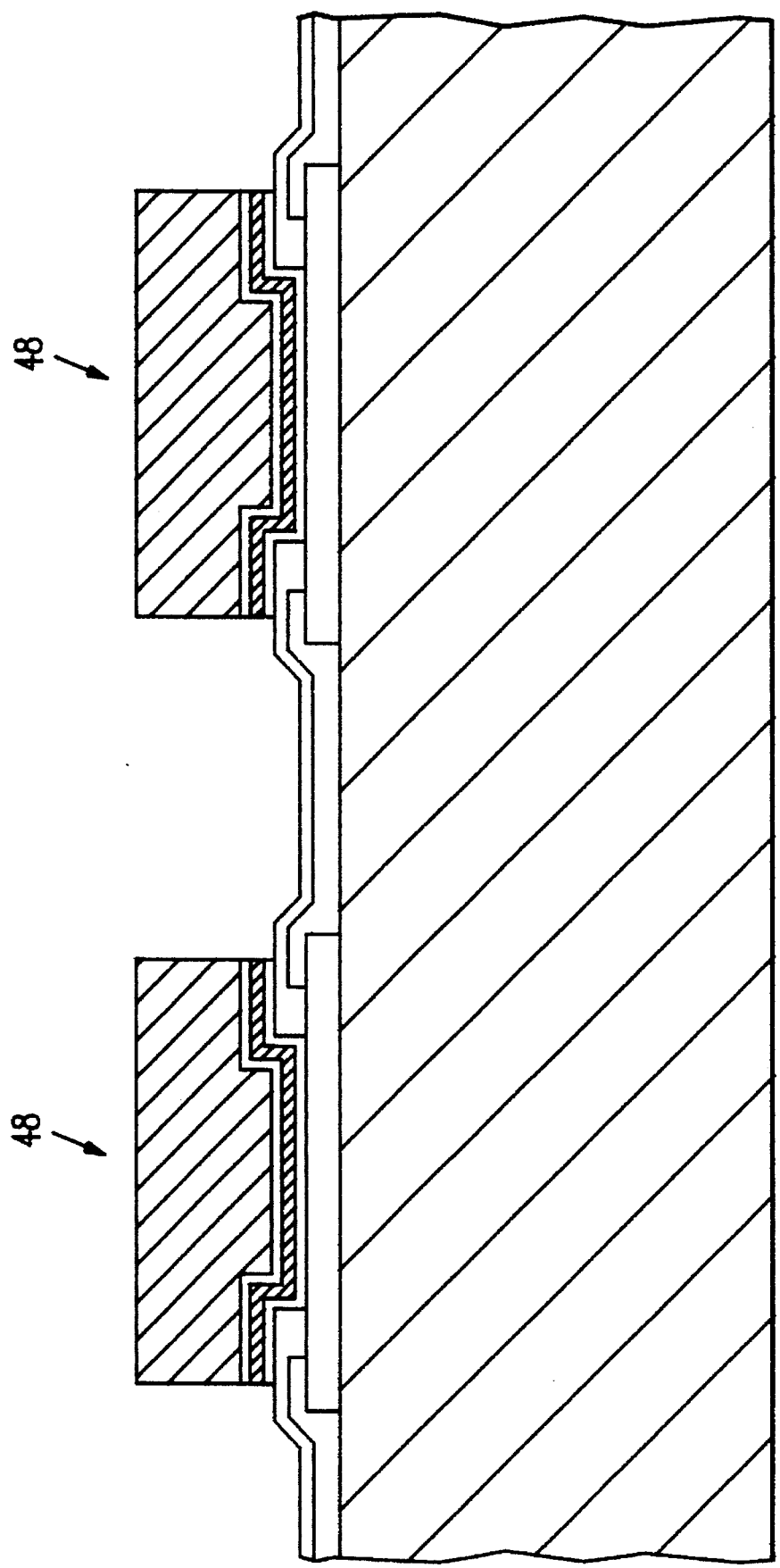

METHOD FOR FORMING SOLDER BUMPS IN SEMICONDUCTOR DEVICES

BACKGROUND OF THE INVENTION

This invention relates generally to etching processes in semiconductor wafer processing and more specifically to solder bump processing in flip chip technology.

The formation of integrated circuit (IC) chips involves many processes. From design to production, each aspect requires considerable attention to detail and precision to create and maintain a high yield of functioning chips. One such aspect is the method employed for interconnection and packaging of a patterned wafer die.

A traditional method of input-output (I/O) interconnection is wirebonding. This involves the bonding of I/O pads around the periphery of the wafer die with wires on a leadframe, followed by encapsulation into a chip package or packaging in a cavity-type package. An example of a typical wirebond is illustrated in FIG. 1a. As shown, a die 10 is bonded to a leadframe or substrate surface 12 by a wire bond 14. While this is a satisfactory implementation, the wafer area required for the bond pads restricts full utilization of wafer dies with increasing feature density on a single die.

Another form of interconnection is known as tape automated bonding or TAB bonding. In this method, the lead frame is bonded to a die by means of a tape placed over the die. One side of the tape goes over the die, while the other side of the tape goes on the leadframe or interconnects to a substrate board. Contacts on the die are plated up, i.e., grown above the circuit, to form "bump" contacts on the IC so that the passivation layers on the die are not cracked by the application of the tape. While this has been used successfully for many years in semiconductor manufacturing, there are risks of cracking the die during the tape application and forming sites of destruction, so that some fabrication facilities have begun to phase it out for cost-effectiveness reasons. Cost is also a factor since custom tapes are needed for each specific chip design.

Alternatively, flip chip technology provides an increased density of possible interconnections on a single die without risking the integrity of the die. Flip chip devices implement connections directly on the wafer so that the wafer can be "flipped" over, as the name implies, and bonded directly to a substrate, such as bonding to trace pattern wiring pads on a printed circuit board. The bonding is done via solder bumps, i.e., soldered areas formed on top of the die. FIG. 1b illustrates a chip 16 having solder bumps 18 connecting it to a substrate 20. It is the integrity of these solder bumps that determines the integrity of the interconnection and chip functionality for a given use.

In prior art practices, these solder bumps are formed by depositing a layer of solder into openings over bond pads on a patterned wafer and then etching the areas outside these soldered bond pads to leave the solder bumps 18. Solder deposition includes using evaporation methods, which are expensive and time-consuming, or using plating techniques. The etched areas are typically multiple metal cathode layers each of which requires a separate etching and cleaning step for removal. For example, aluminum, nickel, and copper are typical metals used for the metal layers. Accordingly, a standard etchant for the copper and nickel layers is a nitric acid solution, while a strongly phosphoric acid (>80% phosphoric acid) solution is commonly used for the aluminum layer. These etchants have been found to attack the applied solder, making them less than ideal for solder bump formation. Further, each time the wafer is etched and cleaned to remove each of the metal layers, there is an increased risk of contamination and degradation of the solder bumps, so that every added step increases production time and cost. Therefore, in a continuing effort to improve upon solder bump formation, the present invention uses a dilute phosphoric acid solution to remove the metal layers in a more efficient and effective manner without degrading the solder layer. In this way, a simpler, one-step etching process results, which offers less waste production and less chemical consumption.

SUMMARY OF THE INVENTION

In accordance with the present invention, a method for forming solder bumps begins with a semiconductor wafer that has been patterned with bond pad areas. A plurality of distinct metal layers are then deposited over the wafer. Subsequently, solder is deposited by way of plating through a mask over the metal layers in the bond pad areas. After the removal of the mask, the metal layers outside of the soldered areas are etched using a dilute phosphoric acid solution, which includes phosphoric acid, acetic acid, hydrogen peroxide, and deionized water. By the use of this solution, the metal layers are removed without attacking the soldered areas. Thus, a pattern of solder bumps are formed on the integrated circuit (IC) wafer.

In one embodiment, the metal layers include distinct layers of aluminum, nickel-vanadium, and copper. In an alternate embodiment, the aluminum layer is eliminated. By way of example, the composition of the dilute phosphoric acid solution includes approximately 1 to 25% phosphoric acid, 63 to 98% deionized water, 1 to 10% acetic acid, and 0.1 to 2% hydrogen peroxide by volume for use in the etching step.

With the present invention, a single etchant, in the form of a dilute phosphoric acid solution, is used to remove the deposited metal layers outside of the soldered areas. This increases the efficiency of forming solder bumps of high integrity, which are suitable for flip chip applications.

BRIEF DESCRIPTION OF THE DRAWINGS

The invention, together with further objects and advantages thereof, may best be understood by reference to the following description taken in conjunction with the accompanying drawings in which:

FIG. 2e illustrates the substrate of FIG. 2d following the removal of the mask and the metal layers outside of the deposited solder leaving a series of solder bumps.

DETAILED DESCRIPTION OF THE PREFERRED EMBODIMENTS

The present invention relates to solder bump formation for use in flip chip IC interconnection. FIGS. 2a–2e illustrate the step-by-step appearance of a substrate processed in accordance with a method of the present invention, the overall steps of which are presented with reference to FIG. 3.

Figure 1A:
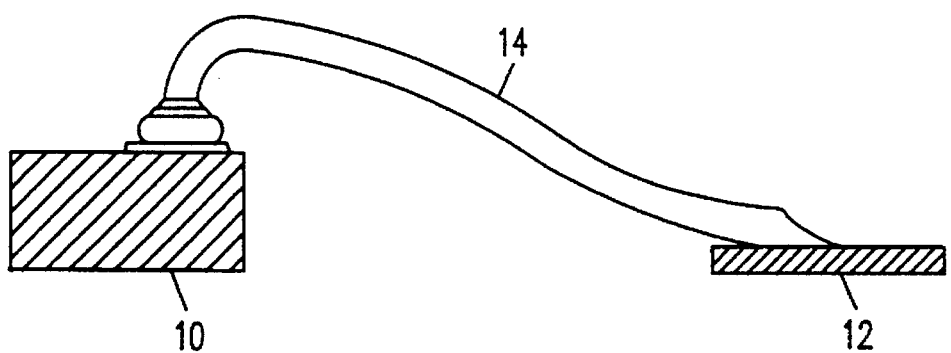
FIG. 1a is an illustration of a wire bond of the prior art.
Figure 1B:
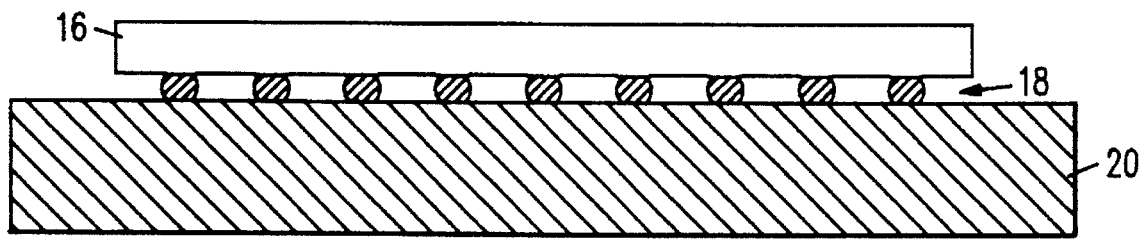
FIG. 1b is an illustration of a standard solder bumped die inverted on a substrate.
Figure 2A:
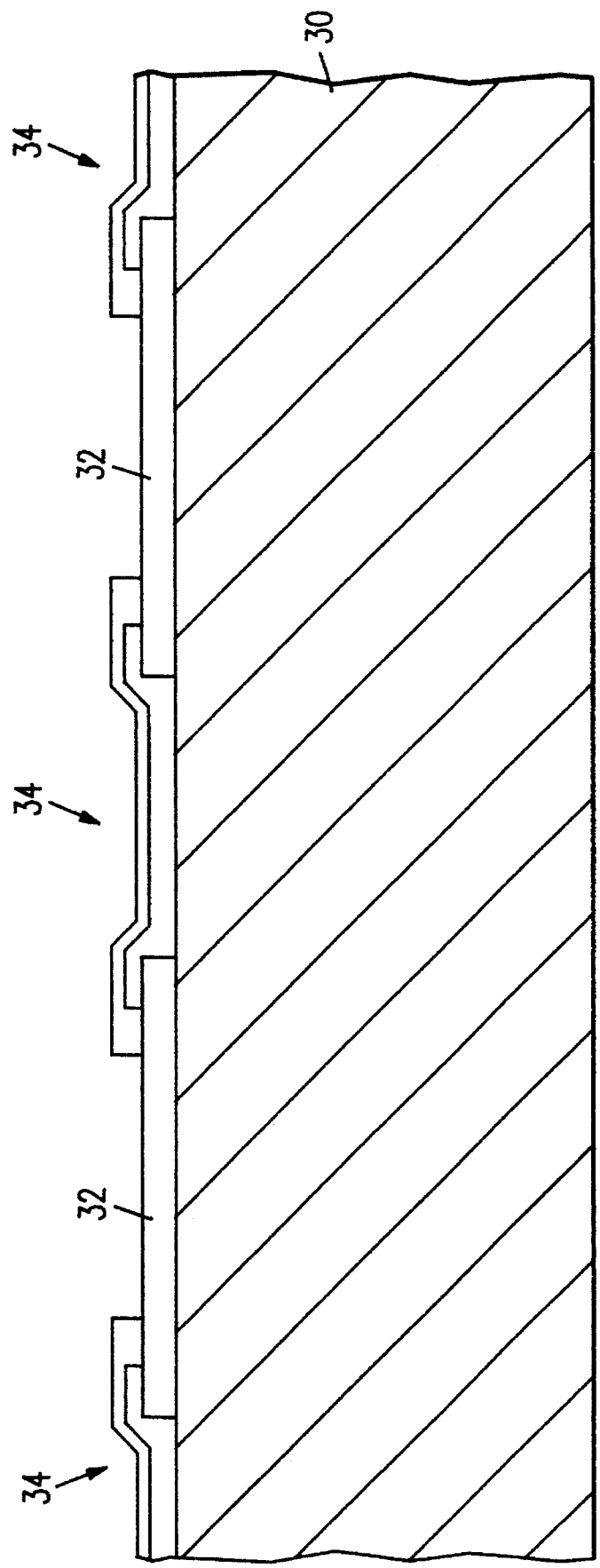
FIG. 2a illustrates an initial substrate with bond pads and passivation layers.

FIG. 2a illustrates an initial substrate 30, which may be formed of any suitable material such as a silicon wafer or gallium arsenide wafer that may be patterned to include many layers of features, as is appreciated by those skilled in the art, and that is generically referred to as a substrate for purposes of this description. The topmost layer of substrate 30 has been patterned to have bond pads 32 and passivation layers 34. The bond pads 32 are formed by depositing a layer of aluminum (Al) over the substrate 30 and patterning the layer to form the bond pads 32. The passivation layers 34 preferably include silicon dioxide deposited by chemical vapor deposition (CVD) or other suitable methods as is well known to those skilled in the art. The passivation layers are etched using standard techniques from the bond pads 32, so that the bond pads 32 are exposed for subsequent interconnecting.

Figure 2B:
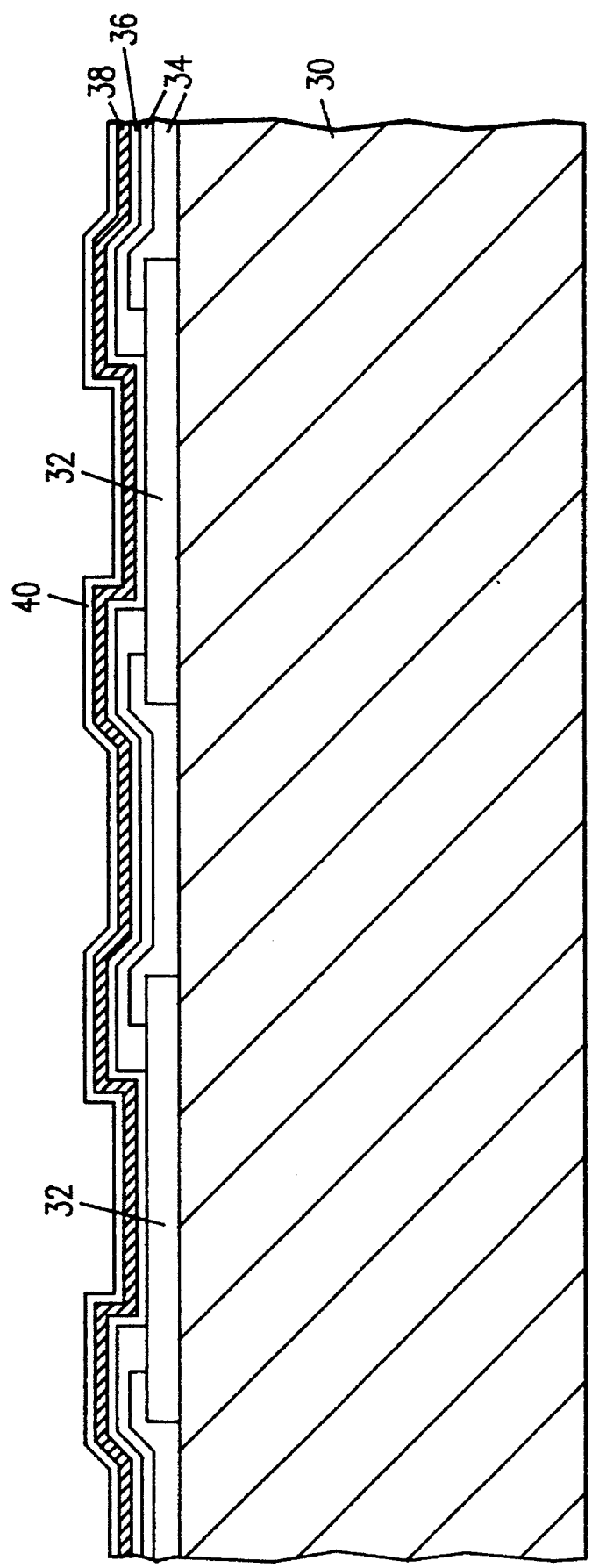
FIG. 2b illustrates the substrate of FIG. 2a with the addition of a plurality of metal layers.

FIG. 2b illustrates the addition of metal layers 36, 38, and 40 over the passivation layers 34 and bond pads 32. For the application of metal layers 36-40, the substrate, completed through passivation, is ashed, wet cleaned, sputter etched, and sputter deposited. By way of example, the first layer may be an approximately 4 kiloAngstrom (kÅ) layer of aluminum (Al) for layer 36, which acts as an adhesive layer. An approximately 2 kÅ layer of nickel-vanadium (NiV) is then deposited for layer 38 to act as a barrier layer to prevent migration between the surrounding metal layers. Typically, the NiV comprises approximately 93% nickel and 7% vanadium. An approximately 4 kÅ layer of copper (Cu) then follows for layer 40, which acts as a cathode layer for subsequent solder plating. Of course, the thickness of these layers may be varied in accordance with the needs of a particular system.

Figure 2C:
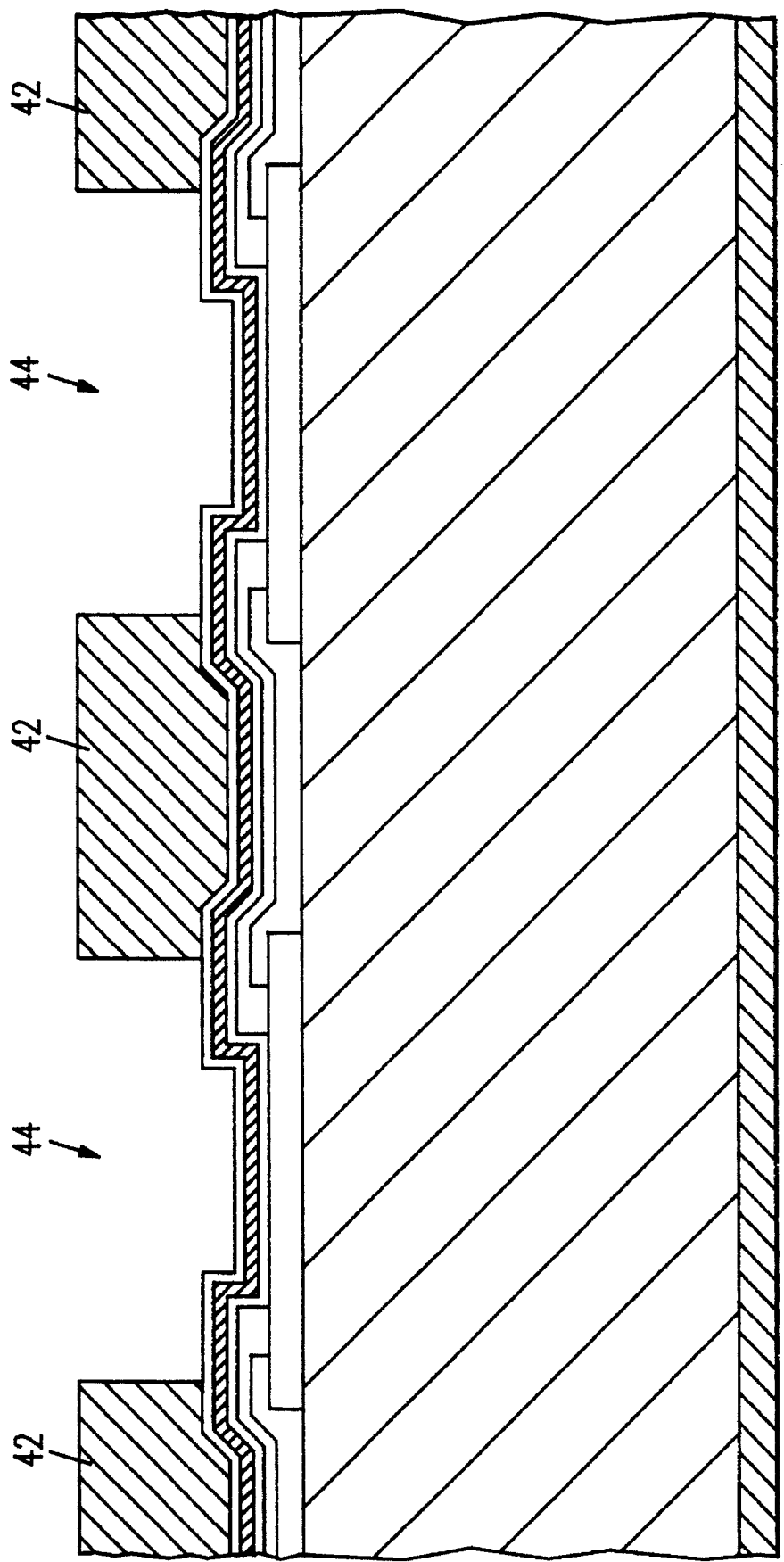
FIG. 2c illustrates the substrate of FIG. 2b with a photo-resistive mask.
Figure 2D:
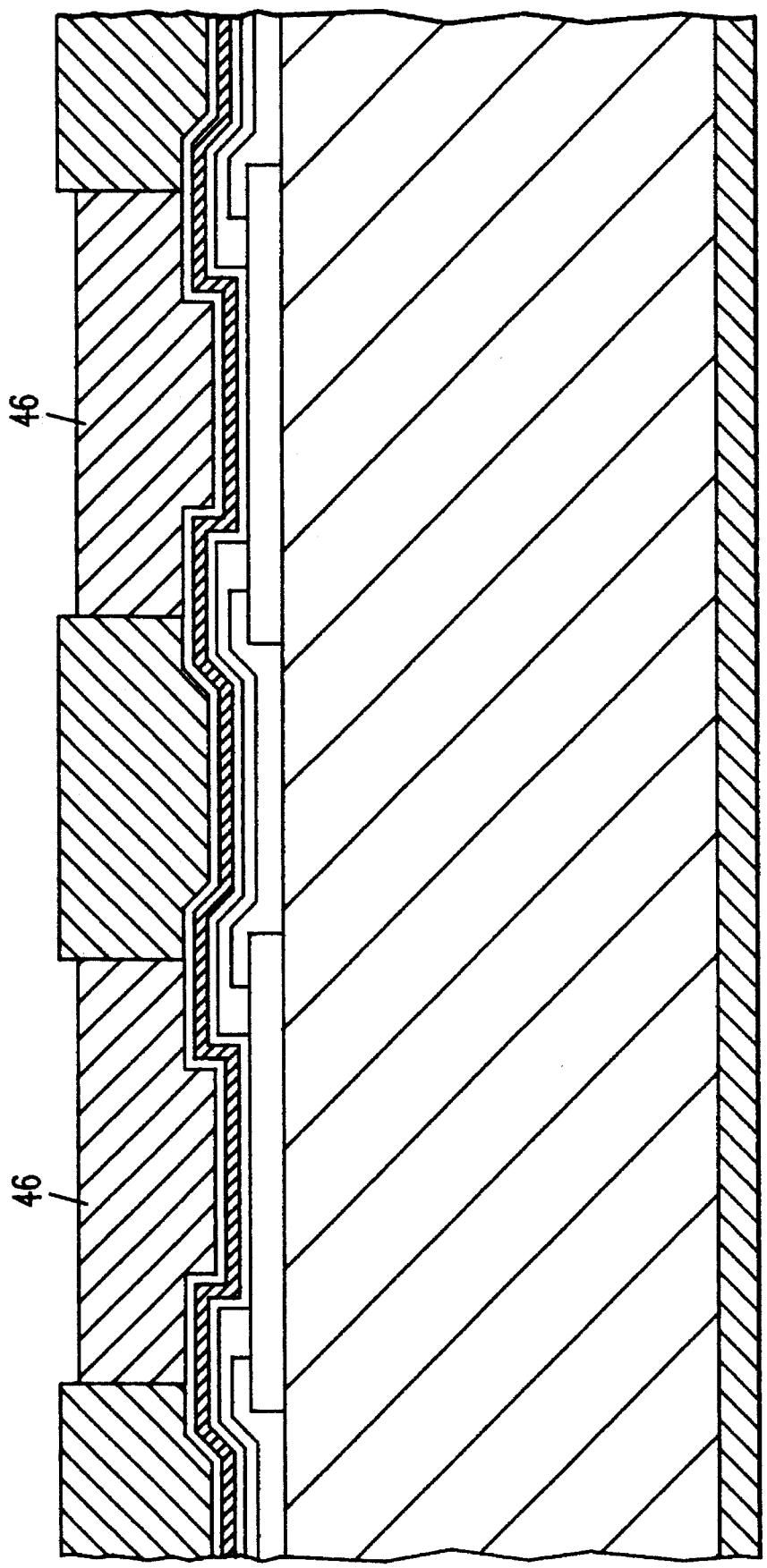
FIG. 2d illustrates the substrate of FIG. 2c with solder deposited through the mask.

Following the deposition of the metal layers 36-40, a layer of photoresistive material 42 is deposited and openings 44 are developed over the bond pad areas by standard photolithographic techniques, the results of which are illustrated in FIG. 2c. The openings 44 expose the areas in which the solder is to be plated. FIG. 2d illustrates the solder-filled areas 46 formed by plating solder over the metal layers on the bond pads. A wide variety of lead/tin solders may be used in the solder plating step. By way of example, solder having in the range of approximately 60-95% lead and 5-40% tin has been found to work well. During the plating process, layer 40 acts as the cathode in order to seed the solder deposition, as is well known to those skilled in the art.

Once the solder has been plated through the openings 44, the photoresistive material is removed in a stripper by standard removal techniques. All of the metal layers 36-40 outside of the solder-filled areas 46 are then etched using a dilute phosphoric acid solution to leave solder bumps 48, as shown in FIG. 2e. The composition of this dilute phosphoric acid solution is preferably approximately in the range of 1 to 25% by volume phosphoric acid, 1 to 10% by volume acetic acid, 0.1 to 2% by volume hydrogen peroxide, and 63 to 98% by volume deionized (DI) water. By way of example, when the etching is done at about 70° C., etching times approximately in the range of 90 to 600 seconds are appropriate, with 130 seconds having been found to work well, when the solution is approximately 10% phosphoric acid, 5% acetic acid, 1% hydrogen peroxide, and 84% DI water. Of course, the etching may be performed at a wide variety of temperatures, and the temperature used will in turn affect the appropriate duration of the etch, as is appreciated by those skilled in the art. When used in this manner, the dilute phosphoric acid solution does not attack the solder layer as other standard acid etchant solutions do.

In comparative experiments, these other standard solutions include a nickel/copper acid etchant and an acid solution used for aluminum etching. As shown in the following table, Table 1, the nickel/copper acid etchant, a dilute nitric acid solution, has approximately 84% DI water, 10% nitric acid, 5% acetic acid, and 1% hydrogen peroxide and is usually applied at about 50° C. The aluminum etchant, a strongly phosphoric acid solution, has approximately 83% phosphoric acid, 11% acetic acid, and 6% DI water and is usually applied at about 60° C. Both of these have been found to attack deposited solder, so that neither of these standard etchants is as well suited for performing the etching that the dilute phosphoric acid solution of the present invention performs.

TABLE 1

|  | Ni/Cu Etch | Al Etch | Dilute Phosphoric |
| --- | --- | --- | --- |
| DI Water: | 84% | 6% | 86% |
| Acetic Acid: | 5% | 11% | 4% |
| $H_2O_2$: | 1% |  | 1% |
| Phosphoric Acid: |  | 83% | 9% |
| Nitric Acid: | 10% |  |  |
| Temperature: | 50° C. | 60° C. | 70° C. |

Figure 3:
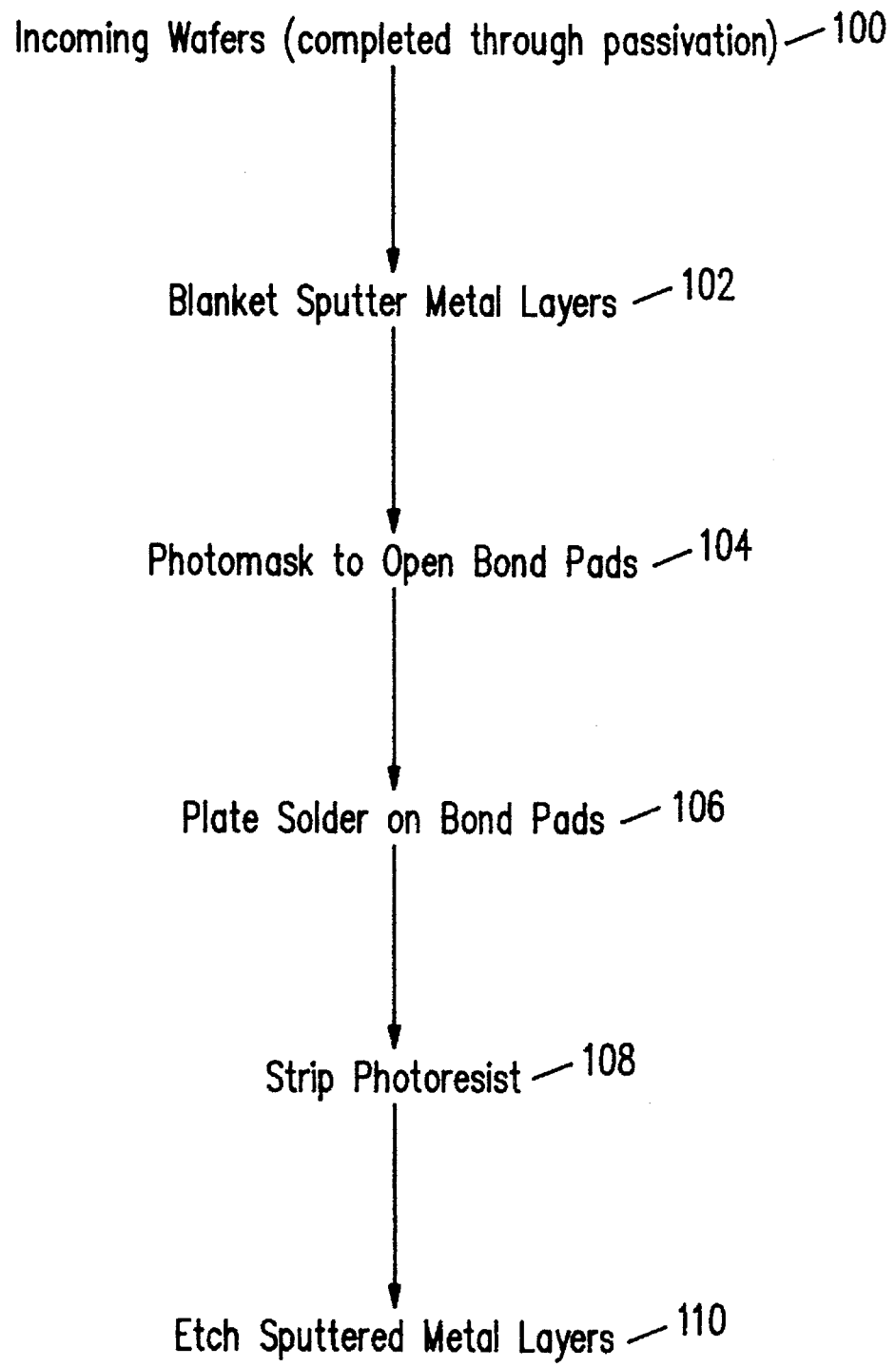
FIG. 3 is a flow diagram illustrating an overall process for forming the solder bumps illustrated in FIG. 2e.

In accordance with the present invention, FIG. 3 is a flow diagram illustrating the overall steps (shown in FIGS. 2a-2e) for forming a series of solder bumps. The process begins in step 100 with wafers which have been processed up through passivation layering (see FIG. 2a). The next step, step 102, is the formation of a plurality of metal layers, as shown in FIG. 2b. The wafer is first ashed and then wet cleaned, sputter etched, and sputter deposited, as previously described. Again, by way of example, a layer to approximately 4 kÅ of aluminum (Al) may be first sputter deposited, followed by an approximately 2 kÅ layer of nickel vanadium (NiV) and an approximately 4 kÅ layer of copper (Cu).

A layer of photoresist is then deposited over the wafer in step 104. This layer is then patterned by standard photolithographic techniques to open the bond pad areas of the wafer, as shown in FIG. 2c. Following an ashing and wet clean, solder is plated into the openings of the photoresist to build up the bumps in step 106 (e.g., FIG. 2d). Upon the completion of the plating, the photoresist is stripped using standard techniques in step 108.

The next step, step 110, is the etching of the sputter deposited metal layers outside of the soldered areas. In prior art practices, each layer, i.e., the Cu layer, the NiV layer, and the Al layer, would have to be etched in separate etching steps with a cleaning step performed in between each etch. In the present invention, all three metal layers are etched during one step using a dilute phosphoric acid solution. Again, the preferable composition of this solution is approximately in the range of 1 to 25% phosphoric acid by volume, 1 to 10% acetic acid by volume, 0.1 to 2% hydrogen peroxide by volume, and the remaining balance 63 to 98% deionized (DI) water by volume. The results of this etching step are shown in FIG. 2e, which illustrates that by this process, solder bumps are formed with one etching step without negatively affecting the size, shape, or integrity of the bump.

In an alternate embodiment, the aluminum layer acting as the adhesive layer in the three metal layer arrangement may be eliminated. For this embodiment, the remaining metal layer thicknesses are preferably adjusted to maintain a total thickness approximately equal to the three layer thickness, e.g., 1 micron.

In another alternate embodiment, the seed layer of copper is replaced by gold. In this case, the etching sequence is slightly altered. The gold layer is first removed using potassium cyanide (KCN) applied for approximately 60 seconds at an approximate temperature of 40° C., for example, before the dilute phosphoric acid solution is used to etch the remaining metal layers.

Although only a few embodiments of the present invention have been described in detail, it should be understood that the present invention may be embodied in many other specific forms without departing from the spirit or scope of the invention. Particularly, the invention has been described in the context of solder deposition involving plating. Alternatively, an evaporation deposition process could also be performed. Further, the composition of the solder may be varied. Although the solder has been described as a lead and tin combination, pure tin solder could also be used.

Further, as will be appreciated by those skilled in the art, variations of the duration and temperature of the etching along with the percentage composition of the etchant components are interrelated. Thus, increases in the duration of etching correspond to decreases in etching temperature or decreases in phosphoric acid concentration. For example, for the solution having approximately 1% by volume phosphoric acid, the etching time is approximately 600 seconds, while the solution having approximately 10% by volume phosphoric acid requires etching for approximately 130 seconds and the solution having approximately 25% by volume phosphoric acid requires etching for approximately 90 seconds. However, when the described solution has more than approximately 32% by volume phosphoric acid, no discernible etching of metal layer NiV occurs.

I claim:

1. A method for forming solder bumps on a substrate, said substrate including bond pad areas, the method comprising the steps of:

depositing a plurality of distinct metal layers over said substrate the distinct metal layers being formed from different materials and including at least two layers formed from materials selected from the group consisting of aluminum, copper, and a nickel-vanadium alloy;

depositing solder through a mask over said metal layers in said bond pad areas;

removing said mask; and etching said metal layers outside of said solder with a dilute phosphoric acid solution consisting of essentially of phosphoric acid, deionized (DI) water, acetic acid, and hydrogen peroxide that does not attack said solder to leave a series of solder bumps on said substrate in said bond pad areas.

2. A method for forming solder bumps on a substrate, said substrate including bond pad areas, the method comprising the steps of:

depositing a plurality of distinct metal layers over said substrate, the distinct metal layers being formed from different materials and including at least two layers formed from materials selected from the group consisting of aluminum, copper, and a nickel-vanadium alloy;

depositing solder through a mask over said metal layers in said bond pad areas;

removing said mask; and etching said metal layers outside of said solder with a dilute phosphoric acid solution consisting essentially of phosphoric acid, deionized (DI) water, acetic acid, and hydrogen peroxide that does not attack said solder to leave a series of solder bumps on said substrate in said bond pad areas, wherein said dilute phosphoric acid solution includes in a range of approximately 1 to 25% by volume phosphoric acid, in a range of approximately 63 to 98% by volume DI water, in a range of approximately 1 to 10% by volume acetic acid, and in a range of approximately 0.1 to 2% by volume hydrogen peroxide.

3. A method as recited in claim 2 wherein said dilute phosphoric acid solution is applied at approximately 70° C.

4. A method as recited in claim 3 wherein said dilute phosphoric acid solution is applied for approximately in the range of 90 to 600 seconds.

5. A method as recited in claim 1 wherein said dilute phosphoric acid solution includes in the range of approximately 1 to 25% by volume phosphoric acid.

6. A method as recited in claim 5 wherein said dilute phosphoric acid solution includes approximately 10% by volume phosphoric acid.

7. A method as recited in claim 5 wherein said dilute phosphoric acid solution includes in the range of approximately 63 to 98% by volume DI water.

8. A method as recited in claim 7 wherein said dilute phosphoric acid solution includes approximately 84% by volume DI water.

9. A method as recited in claim 7 wherein said dilute phosphoric acid solution includes in the range of approximately 1 to 10% by volume acetic acid.

10. A method as recited in claim 9 wherein said dilute phosphoric acid solution includes approximately 5% by volume acetic acid.

11. A method as recited in claim 2 wherein said dilute phosphoric acid solution includes approximately 1% by volume hydrogen peroxide.

12. A method as recited 1 wherein said metal layers include a layer of aluminum, a layer of nickel-vanadium, and a layer of copper.

13. A method as recited in claim 1 wherein said metal layers include a layer of nickel-vanadium and a layer of copper.

14. A method as recited in claim 1 further comprising a top layer of gold formed over the plurality of distinct metal layers, and wherein said gold layer is etched with potassium cyanide prior to said step of etching with said dilute phosphoric acid solution.

15. A method for forming solder bumps over a substrate having a pattern of bond pad areas and a passivation layer deposited over said substrate and patterned to have openings in said bond pad areas, the method comprising the steps of:

depositing a plurality of distinct metal layers over the substrate, the distinct metal layers being formed from different materials and including at least two layers formed from materials selected from the group consisting of aluminum, copper, and nickel-vanadium alloy;

depositing a photoresistive layer over said metal layers:

developing openings in said photoresistive layer over said bond pad areas on said substrate;

plating solder over said metal layers into said openings;

removing said photoresistive layer; and etching exposed portions of the metal layers from said substrate outside of said solder with a dilute phosphoric acid solution consisting essentially of phosphoric acid deionized (DI) water, acetic acid, and hydrogen peroxide that does not attack said solder to leave a series of solder bumps on said substrate.

16. A method as recited in claim 15 wherein said step of etching is performed at approximately 70° C.

17. A method as recited in claim 15 wherein said dilute phosphoric acid solution includes in a range of approximately 1 to 25% by volume phosphoric acid.

18. A method as recited in claim 17 wherein said dilute phosphoric acid solution includes approximately 10% by volume phosphoric acid.

19. A method as recited in claim 17 wherein said dilute phosphoric acid solution includes in a range of approximately 63 to 98% by volume DI water.

20. A method as recited in claim 19 wherein said dilute phosphoric acid solution includes approximately 84% by volume DI water.

21. A method as recited in claim 19 wherein said dilute phosphoric acid solution includes in a range of approximately 1 to 10% by volume acetic acid.

22. A method as recited in claim 21 wherein said dilute phosphoric acid solution includes approximately 5% by volume acetic acid.

23. A method as recited in claim 21 wherein said dilute phosphoric acid solution includes in a range of approximately 0.1 to 2% by volume hydrogen peroxide.

24. A method as recited in claim 23 wherein said dilute phosphoric acid solution includes approximately 1% by volume hydrogen peroxide.

25. A method as recited claim 15 wherein said step of depositing further comprises depositing a layer of aluminum over said substrate, depositing a layer of nickel-vanadium over said layer of aluminum, and depositing a layer of copper over said layer of nickel-vanadium.

26. A method as recited claim 15 wherein said step of depositing further comprises depositing a layer of nickel-vanadium over said substrate and depositing a layer of copper over said layer of nickel-vanadium.

27. A method as recited claim 15 wherein said step of depositing further comprises depositing a layer of aluminum over said substrate, depositing a layer of nickel-vanadium over said layer of aluminum, and depositing a layer of gold over said layer of nickel-vanadium, and wherein said method further includes a step of etching said layer of gold with potassium cyanide prior to said step of etching with a dilute phosphoric acid solution.

28. A method as recited in claim 15 wherein said solder comprises lead and tin.

29. A method as recited in claim 28 wherein approximately 60–95% of said solder is lead and approximately 5–40% is tin.

* * * * *

UNITED STATES PATENT AND TRADEMARK OFFICE
CERTIFICATE OF CORRECTION

PATENT NO. : 5,508,229
DATED : April 16, 1996
INVENTOR(S) : Mark H. Baker

It is certified that error appears in the above-indentified patent and that said Letters Patent is hereby corrected as shown below:

Column 6, line 60, after "layers" replace the ":" with a --;--

Column 7, line 1, after acid, (2nd occurrence), insert a --,--

Signed and Sealed this

Twelfth Day of November, 1996

Attest:

BRUCE LEHMAN

*Attesting Officer*   *Commissioner of Patents and Trademarks*